(12) United States Patent
O (10) Patent No.: US 8,491,138 B2
(45) Date of Patent: Jul. 23, 2013

(54) CONDENSING SYSTEM OF SOLAR LIGHT FOR NATURAL LIGHTING

(75) Inventor: Se Dae O, Busan (KR)

(73) Assignee: Nsnet Co., Ltd., Busan (KR)

( * ) Notice: Subject to any disclaimer, the term of this patent is extended or adjusted under 35 U.S.C. 154(b) by 744 days.

(21) Appl. No.: 12/675,291

(22) PCT Filed: Aug. 27, 2008

(86) PCT No.: PCT/KR2008/005021
§ 371 (c)(1),
(2), (4) Date: Feb. 25, 2010

(87) PCT Pub. No.: WO2009/028868
PCT Pub. Date: Mar. 5, 2009

(65) Prior Publication Data
US 2010/0243054 A1    Sep. 30, 2010

(30) Foreign Application Priority Data

Aug. 27, 2007  (KR) ................. 10-2007-0086162
Feb. 4, 2008   (KR) ................. 10-2008-0011131

(51) Int. Cl.
*G02B 7/18* (2006.01)

(52) U.S. Cl.
USPC ........... 359/855; 359/597; 359/872; 362/557; 385/900

(58) Field of Classification Search
USPC ................. 359/597, 850, 851, 853, 855, 872; 359/876, 877; 136/259; 126/683, 684, 696, 126/698; 362/557; 385/31, 900; 52/200; 353/3
See application file for complete search history.

(56) References Cited

U.S. PATENT DOCUMENTS

| | | | | |
|---|---|---|---|---|
| 4,297,000 A | * | 10/1981 | Fries | 362/557 |
| 4,389,085 A | * | 6/1983 | Mori | 359/591 |
| 4,791,533 A | * | 12/1988 | Hane | 362/1 |
| 4,984,880 A | * | 1/1991 | Mori | 359/855 |
| 5,581,447 A | * | 12/1996 | Raasakka | 362/557 |
| 5,980,052 A | * | 11/1999 | Thor et al. | 359/877 |
| 6,134,842 A | | 10/2000 | Cheng et al. | |
| 6,299,317 B1 | | 10/2001 | Gorthala | |
| 6,493,145 B1 | * | 12/2002 | Aoki et al. | 359/597 |
| 6,603,069 B1 | * | 8/2003 | Muhs et al. | 136/246 |
| 6,840,645 B2 | * | 1/2005 | Eisenman et al. | 362/2 |
| 7,639,423 B2 | * | 12/2009 | Kinney et al. | 359/591 |
| 7,946,287 B2 | * | 5/2011 | Papadopoulos | 126/688 |

(Continued)

FOREIGN PATENT DOCUMENTS

| | | | |
|---|---|---|---|
| JP | 61172108 A | * | 8/1986 |
| JP | 62173414 A | * | 7/1987 |
| KR | 10-2001-0086678 | | 9/2001 |
| KR | 10-0415238 | | 1/2004 |
| KR | 10-2004-0019444 | | 3/2004 |

OTHER PUBLICATIONS

International Search Report for PCT/KR2008/005021 dated Mar. 17, 2009.

*Primary Examiner* — Frank Font
(74) *Attorney, Agent, or Firm* — KED & Associates, LLP (57) ABSTRACT

The present invention relates to a solar light condensing system for realization of natural lighting, and more particularly, to a vertical solar light condensing system which is formed on an outer wall of a building using a reflective member and a light condensing member so as to secure large light condensing area and to increase light condensing efficiency.

13 Claims, 9 Drawing Sheets

U.S. PATENT DOCUMENTS

| | | | |
|---|---|---|---|
| 7,982,956 B2 * | 7/2011 | Kinney et al. | 359/591 |
| 2003/0147261 A1 * | 8/2003 | Babbitt et al. | 362/582 |
| 2004/0022071 A1 * | 2/2004 | Cheng et al. | 362/557 |
| 2008/0266664 A1 * | 10/2008 | Winston et al. | 359/592 |

* cited by examiner

CONDENSING SYSTEM OF SOLAR LIGHT FOR NATURAL LIGHTING

TECHNICAL FIELD

The present invention relates to a solar light condensing system for realization of natural lighting, and more particularly, to a vertical solar light condensing system which is formed on an outer wall of a building using a reflective member and a light condensing member so as to secure large light condensing area and to increase light condensing efficiency.

The present invention also relates to a solar light condensing system in which solar light is converted into straight light with high luminous flux of light so as to provide solar light without restriction of a transmission distance.

BACKGROUND ART

A natural lighting system (including a solar light condensing system) which has been developed up to date or has been commercially used can be classified into a fixed-type lighting system using an optical duct and a light condensing system using a solar light tracking lens (a spherical lens or a fresnel lens). In the fixed-type lighting system using an optical duct, efficiency of condensing solar light is lower than that of in solar light tracking, but lighting is possible regardless of a sky condition (a weather state). On the other hand, in the light condensing system using solar light tracking, lighting is possible in a clear sky condition or an overcast sky condition and light condensing efficiency is high.

Excellence of both lighting systems can be hardly compared. With regard to this, the fixed-type lighting system is used in indoor lighting and the light condensing system using solar light tracking is used in local area lighting in indoor.

In particular, the natural lighting system using solar light tracking is divided into a reflective mirror type (a plane or a curved reflector) and a lens type, based on a principle of light condensing, and is divided into a reflective mirror type and an optical fiber type, based on a light transmission method.

In the reflective mirror type, solar light is transmitted by a reflective mirror without separately using a light condenser and thus, long distance transmission for solar light is possible. However, a size of the reflective mirror and a space for light transmission should be sufficiently secured. In the lens type, there are limitations in a light transmission distance (within 30 m) and in economical efficiency of the optical fiber due to light transmission using the optical fiber, thereby having no practical use.

In addition, the conventional solar light condensing system is installed to a roof of a building. However, in environment where high buildings with more than five stories (including apartments) as in Korea, there is a great need of installing the solar light system on outer walls of the buildings.

The conventional solar light condensing system has a lens or a reflective mirror used in condensing solar light which always face solar light vertically. However, due to the climate and environmental characteristics in Korea located at an solar altitude of between 30 degrees and 70 degrees, all solar light condensing system using solar light tracking must be separately installed on surfaces of roofs of the buildings. When the solar light condensing system is installed to outer walls of the buildings, light condensing is difficult and efficiency of light condensing is nearly 0 and thus, the solar light condensing system is hardly used.

In addition, when the solar light condensing system is installed to roofs of the high buildings, there is a limitation in a distance for transferring condensed solar light and difficulties in making good appearance of the buildings and managing the system.

DISCLOSURE

Technical Problem

The present invention provides a solar light condensing system which can achieve high light condensing efficiency by using a front surface reflective member and a condenser lens from an outer wall of a building.

The present invention also provides a solar light condensing system which can be installed to an outer wall of a building, regardless of a form and location of a building, so as to secure a large light condensing area and for a natural lighting system to be applied in each story of a high building without restriction of a transferring distance.

Technical Solution

For achieving the object of the present invention, a vertical solar light condensing system according to the one embodiment of the present invention comprises a reflective member formed to be spaced apart from the outer wall of the building receiving solar light and reflecting the received solar light in parallel to a direction of the outer wall of the building a light condensing member condensing the solar light reflected from the reflective member and an optical fiber member connected to the light condensing member transmitting the condensed light.

The invention further comprises a case member for fixing inside the reflective member and positioning the condensing member inside it.

And according to the different embodiment of the present invention, a vertical solar light condensing system comprises a rotating frame formed on the outer wall of the building fixing a reflective member and rotating right and left for tracking a location of solar light a reflective member fixed inside the rotating frame receiving solar light and reflecting the received solar light in parallel to a direction of the outer wall of the building, a light condensing member condensing the solar light reflected from the reflective member and an optical fiber member connected to the light condensing member transmitting the condensed light.

The reflective member may mono rotates upward and downward for tracking a location of solar light.

The reflective member may be formed by being fixed to the rotating frame in a form of multi-layers, each layer comprising one reflective member and may be a front surface reflective plate or a front surface reflective mirror.

According to the different embodiment of the present invention, a vertical solar light condensing system comprises a curved reflective member formed on an outer wall of a building receiving solar light, reflecting the received solar light to a regular direction, and condensing the reflected light and an optical fiber member transmitting light condensed in the curved reflective member.

The reflective member or the curved reflective member according to the embodiments of the invention may biaxially rotates upward-and-downward and right-and-left for tracking a location of solar light.

The curved reflective member may be a front surface reflective plate or a front surface reflective mirror.

The light condensing member may be a fresnel lens or an aspherical lens.

The optical fiber member may be formed of a plastic optical fiber or a glass optical fiber.

And the system further comprises a location correcting device formed on a connection part of the optical fiber member which is disposed behind the light condensing member correcting the location of the reflective member or a curved reflective member.

And the system further comprises a filter connected to the light condensing member blocking heat and ultraviolet light of the condensed light.

According to the different embodiment of the present invention, a solar light condensing system comprises a reflective member reflecting incident solar light, a light condensing member formed in parallel to and to be spaced apart from the reflective member condensing solar light transmitting from the reflective member, a lens member formed on the lower part of the light condensing member converting the condensed solar light into high-luminous flux straight parallel light; and a light transmission member connected to the lower part of the lens member transmitting the high-luminous flux straight parallel light and supplying light.

The reflective member may comprise a light tracking control unit tracking solar light according to a location of solar light and a reflection unit reflecting the solar light tracked by the light tracking control unit to a regular direction.

The light condensing member may comprise a reflection unit that is inclined reflecting the solar light transmitted from the reflective member and transmitting the light to the lower part and a fresnel lens formed on the lower part of the reflection unit condensing the transmitted solar light.

The reflection unit may be formed of a reflective mirror or a prism panel.

The prism panel comprises a solar light battery module on an inclined surface.

The system may further comprise an optical duct, wherein the prism panel is formed on the upper part of the optical duct, the fresnel lens is formed inside the optical duct and on the lower part of the prism panel, the lens member is formed on the lower part of the prism panel, and the light transmission member is connected to the lower part of the lens member.

Preferably, the prism panel may be semi-permeable so as for solar light and skylight to be simultaneously permeated.

The lens member may be formed of a concave lens. Here, the lens member may further comprises a convex lens on the lower part of the concave lens and may further comprises a curved lens on the upper part of the concave lens.

The light transmission member may be hollow so as for the solar light to be transmitted straight through air.

A thickness of the light transmission member may be determined according to a solar light transmission distance.

The light transmission member may further comprises a reflective element on a bent unit so as to reflect the straight solar light to 90 degrees.

Advantageous Effects

In the solar light condensing system according to the present invention, a front surface reflective member and a condenser lens on an outer wall of a building are used in such a climate condition in Korea located at an solar altitude of between 30 degrees and 70 degrees and thus, high light condensing efficiency can be achieved.

In addition, the solar light condensing system can be installed to an outer wall of a building, regardless of a location of the building, so as to secure a large light condensing area and a natural lighting system can be applied to each story of a high building without restriction of a transferring distance.

Moreover, condensed solar light is converted into parallel light with high luminous flux of light so as to transmit light and thus, light loss can be reduced during light transmission and light condensing efficiency can be maximized.

BEST MODE

Figure 1:
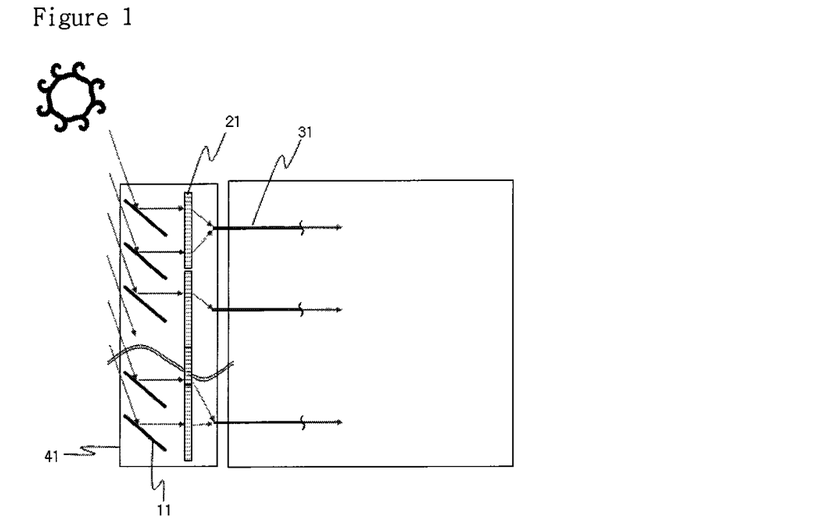
FIG. 1 is a cross sectional diagram schematically illustrating a solar light condensing system according to an embodiment of the present invention.
Figure 2:
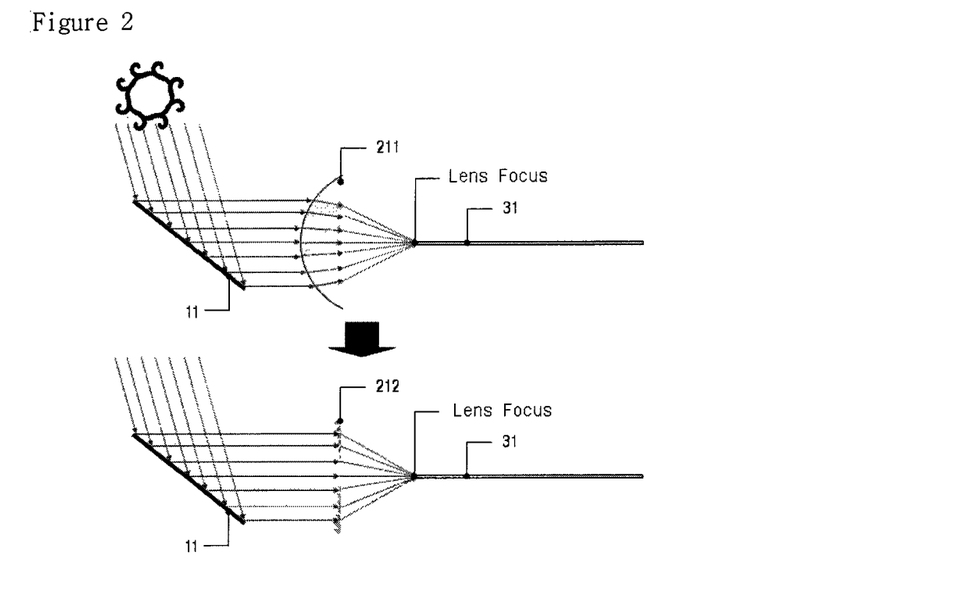
FIG. 2 is an enlarged view of a reflective member and a light condensing member illustrated in FIG. 1.

FIG. 1 is a cross sectional diagram schematically illustrating a solar light condensing system according to an embodiment of the present invention; FIG. 2 is an enlarged view of a reflective member 11 and a light condensing member 21 illustrated in FIG. 1; and FIG. 3 is a perspective view schematically illustrating the solar light condensing system of FIG. 1.

Figure 3:
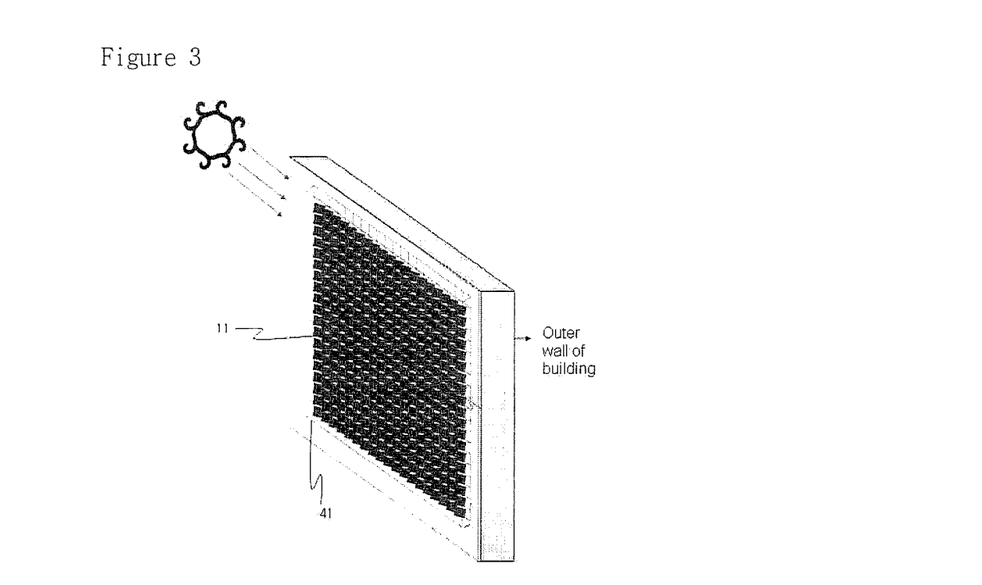
FIG. 3 is a perspective view schematically illustrating the solar light condensing system of FIG. 1.

Referring to FIGS. 1 through 3, the solar light condensing system according to the current embodiment of the present invention includes the reflective member 11, the light condensing member 21, and a optical fiber member 31, wherein the reflective member 11 receives solar light and reflects the received solar light to a fixed direction according to changes in location of light, the light condensing member 21 condenses solar light entered from the reflective member 11, and the optical fiber member 31 transfers solar light condensed in the light condensing member. Here, the reflective member 11 and the light condensing member 21 may be included in a case member 41 formed on an outer wall of a building. The case member 41 may be formed of any material having a predetermined solidity and high light transmittance, for example, glass or reinforced plastics.

Also, the reflective member 11 may be formed of any material in which front surface reflection is possible and may be a front surface reflective plate or a front surface reflective mirror.

In addition, the light condensing member 21 may be formed of any material which can condense solar light entered from the reflective member 11 and may be a fresnel lens 211 or an aspherical lens 212.

A size and gaps of top, bottom, left, and right of the reflective member 11 vary according to where the reflective member 11 is installed and may be determined in various ways in consideration of an altitude difference in location of solar light throughout the year.

Also, a size and the number of the light condensing member 21 may be determined in various ways in consideration of amount of light condensed in the reflective member 11, light condensing efficiency, a distance of light being transmitted, and an area to which light is distributed.

Figure 4:
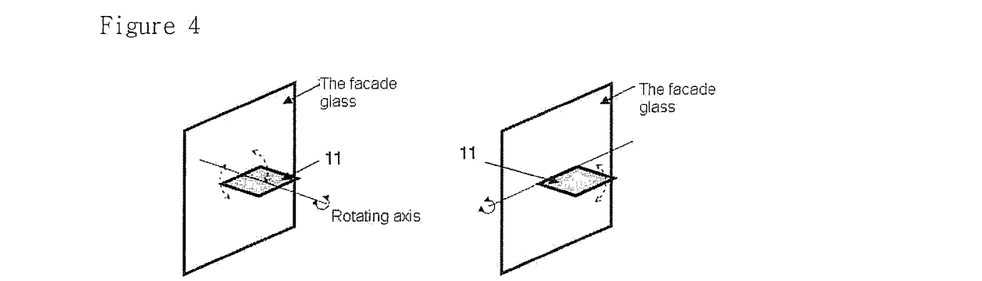
FIG. 4 illustrates an angle of inclination being adjusted by biaxial rotation of a reflective member according to an embodiment of the present invention.

FIG. 4 illustrates an angle of inclination being adjusted by biaxial rotation of the reflective member 11 according to an embodiment of the present invention.

Referring to FIG. 4, the reflective member 11 may be formed to biaxially rotate upward-and-downward and right-and-left for location tracking according to the location of solar light.

Since the light condensing member 21 may only condenses light incident in a line on a normal surface, the reflective member 11 is formed to biaxially rotate according to the location of solar light.

Figure 5:
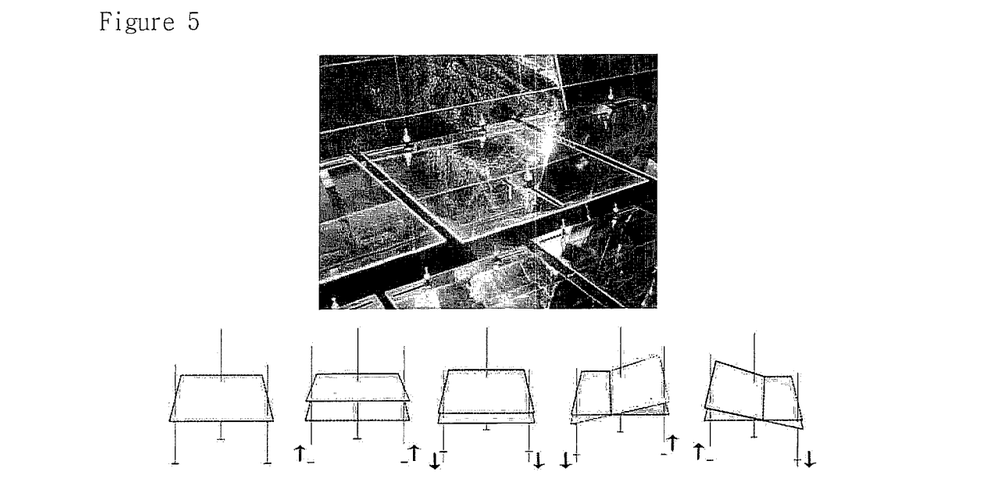
FIG. 5 illustrates the reflective members according to an embodiment of the present invention being fixed by a wire member and adjusted by biaxial rotation.

FIG. 5 illustrates the reflective members 11 being fixed by wire members.

Referring to FIG. 5, the reflective member 11 is fixed by the wire member so as to control tension of a wire and thus, the reflective member 11 may biaxially rotate. In addition, the reflective member 11 may be connected to a case member through a hinge joint and thus, may be biaxially rotated. Moreover, the reflective member 11 may be realized in various ways, if the reflective member 11 can be biaxially rotated.

The reflective member 11 may also control biaxial rotation in upward-and-downward and right-and-left precisely by a motor means such as a servo motor or a step motor.

Figure 6:
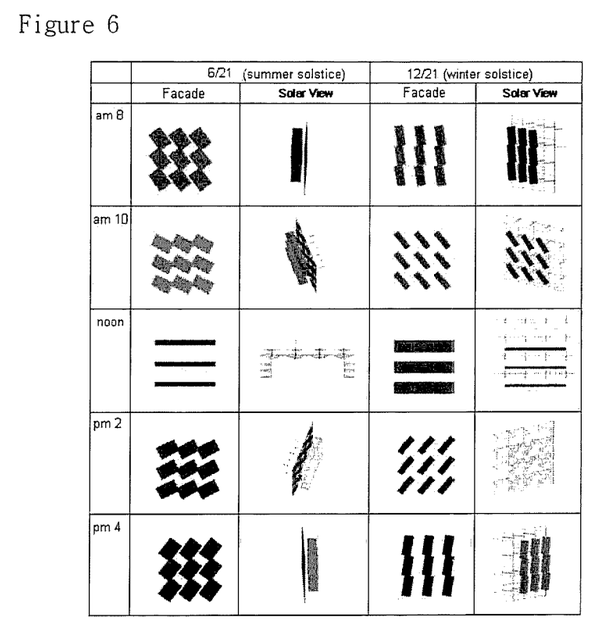
FIG. 6 is a table schematically illustrating changes in inclination of a reflective member according to location of solar light.

FIG. 6 is a table schematically illustrating changes in inclination of the reflective member 11 according to the location of solar light.

Referring to FIG. 6, the reflective member 11 biaxially rotates according to the location of solar light based on a season (date) and time so as to condense light. Tracking of the location of solar light and controlling of the reflective member 11 are not main concerns of the present invention and are obvious to those of ordinary skill in the art to which the present invention pertains so that detailed description thereof is omitted.

Figure 7:
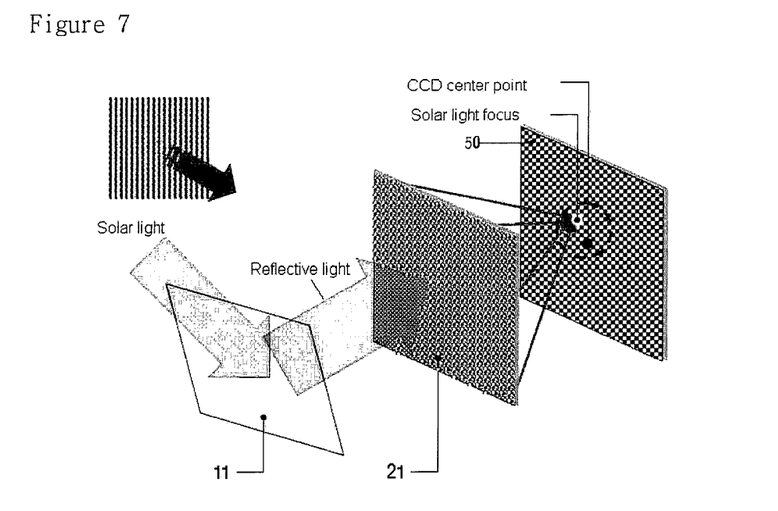
FIG. 7 illustrates a solar light condensing system further including a charge coupled device (CCD) for correcting location of a reflective member.

FIG. 7 illustrates a solar light condensing system further including a location correcting device for correcting the location of the reflective member 11.

Referring to FIG. 7, the solar light condensing system may further include the location correcting device for correcting the location of the reflective member 11. The location correcting device may be any means which can correct the location of condensed solar light being focused. Here, a charge coupled device (CCD) 50 is used as the location correcting device.

The CCD 50 may be formed on a connection part of the optical fiber member 31 which is disposed behind the light condensing member 21 and the center point of the CCD 50 may match with the center of the optical fiber member 31.

When the CCD 50 senses that the focus of light condensed in the light condensing member 21 does not match with the center point of the CCD 50, the inclination of the reflective member 50 may be corrected by adjusting biaxial rotation.

Accordingly, the solar light condensing system according to the current embodiment may further include a CCD detection unit (not shown) and a reflective member control unit (not shown), wherein the CCD detection unit detects whether the focus of light on the CCD 50, the light being condensed by the light condensing member, matches with the center point of the CCD 50 and wherein, the reflective member control unit adjusts the inclination of the reflective member 11 so as to match the focus of light with the center point of the CCD 50, when it is detected through the CCD detection unit that the focus of light and the center point of the CCD 50 are not matched with each other.

In addition, the solar light condensing system may further include a filter (not shown) connected between the light condensing member 21 and the optical fiber member 31 for blocking heat and ultraviolet light. The filter may be selectively installed when a problem arise due to heat and ultraviolet light.

The solar light condensing system may further include a filter (not shown) connected between the light condensing member 21 and the optical fiber member 31 for blocking heat and ultraviolet light. The filter may be selectively installed when a problem arises due to heat and ultraviolet light.

In addition, the solar light condensing system may further include a filter (not shown) connected between the light condensing member 21 and the optical fiber member 31 for blocking heat and ultraviolet light. The filter may be selectively installed when a problem arises due to heat and ultraviolet light.

MODE FOR INVENTION

Hereinafter, the present invention will be described more fully with reference to the accompanying drawings, in which exemplary embodiments of the present invention are shown.

In the embodiments below, features and details which are already described in the previous embodiment are omitted and features and operations which are distinguished from the previous embodiment are described.

Figure 8:
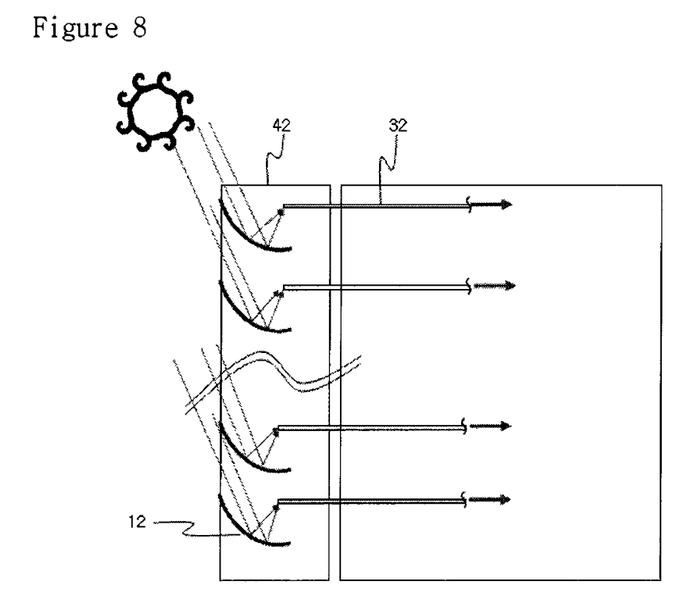
FIG. 8 is a cross sectional diagram schematically illustrating a solar light condensing system according to another embodiment of the present invention.
Figure 9:
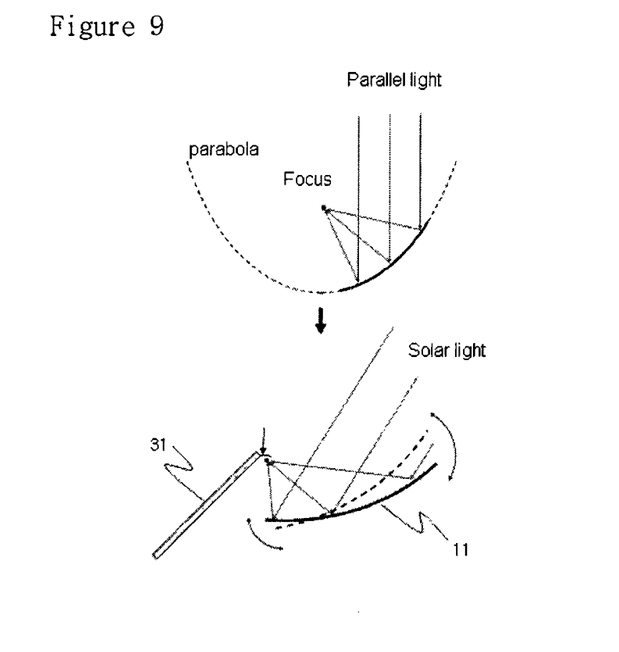
FIG. 9 is an enlarged cross sectional diagram of a curved reflective member illustrated in FIG. 8.

FIG. 8 is a cross sectional diagram schematically illustrating the solar light condensing system according to another embodiment of the present invention and FIG. 9 is an enlarged cross sectional diagram of a curved reflective member 12 illustrated in FIG. 8.

Referring to FIGS. 8 and 9, the solar light condensing system according to the current embodiment may be formed on an outerwall of a building and may include the curved reflective member 12 and an optical fiber member 32, wherein, the curved reflective member 12 receives solar light, reflects the received solar light to a regular direction, and condenses the reflected light and wherein, the optical fiber member 32 transmits light condensed in the curved reflective member 12. In addition, the solar light condensing system may further include a case member 42, in order to fix the curved reflective member 12.

The curved reflective member 12 acts as in the reflective member 11 and the light condensing member 21 illustrated in the previous embodiment. Thus, the curved reflective member 12 receives solar light and reflects the received light, as well as, condenses light into one focus by a parabola formed in the inner curve of the curved reflective member 12.

The curved reflective member 12 may be formed of any material which can reflect solar light and condenses the reflected light and may be a curved front surface reflective plate or a curved surface reflective mirror.

The curved reflective member 12 may be formed to biaxially rotate upward-and-downward and right-and-left for tracking the location of solar light as in the reflective member 11. The curved reflective member 12 which may biaxially rotate is same as the reflective member 11 described above and thus, detailed description of the curved reflective member 12 is omitted here.

The solar light condensing system according to the current embodiment may further include a CCD and a filter, as in the solar light condensing system illustrated in the previous embodiment.

Figure 10:
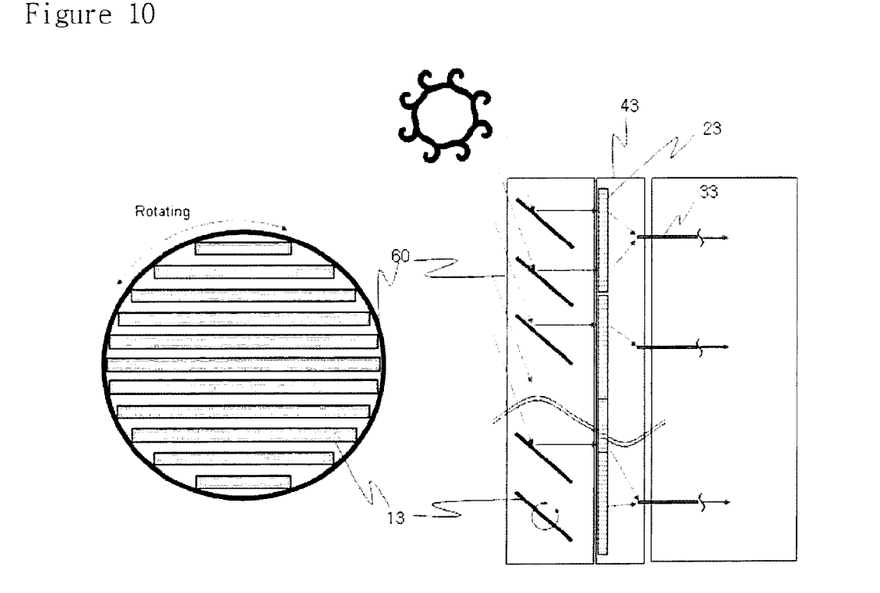
FIG. 10 is a front view and a cross sectional view schematically illustrating a solar light condensing system according to another embodiment of the present invention.

FIG. 10 is a front view and a cross sectional view schematically illustrating a solar light condensing system according to another embodiment of the present invention.

Referring to FIG. 10, the solar light condensing system according to the current embodiment includes a plurality of reflective members 13, a rotating frame 60, a plurality of light condensing members 23, a plurality of optical fiber members 33, and a case member 43, wherein the reflective members 13 receive solar light and reflect the received solar light to a regular direction, the rotating frame 60 fixes the reflective members 13 and rotates right and left for tracking location of solar light, the light condensing members 23 condense solar light reflected from the reflective members 13, the optical fiber members 33 connected to the light condensing members 23 transmit the condensed light, and the case member 43 connected to the rotating frame 60 includes the light condensing members 23.

Here, the reflective members 13, the light condensing members 23, the optical fiber members 33, and the case member 43 are same as the reflective member 11, the light condensing member 21, and the case member 43 described with reference to FIGS. 1 through 3 and thus, the detailed description is omitted.

A plurality of reflective members 11 is formed to be included in one reflective member layer for biaxial rotation. However, since the reflective member 13 is fixed to the rotating frame 60, mono rotation is accomplished by the rotating frame 60, and the reflective member 13 only allows mono rotation upward and downward, one long reflective member 13 may be formed on one reflective member layer.

Figure 11:
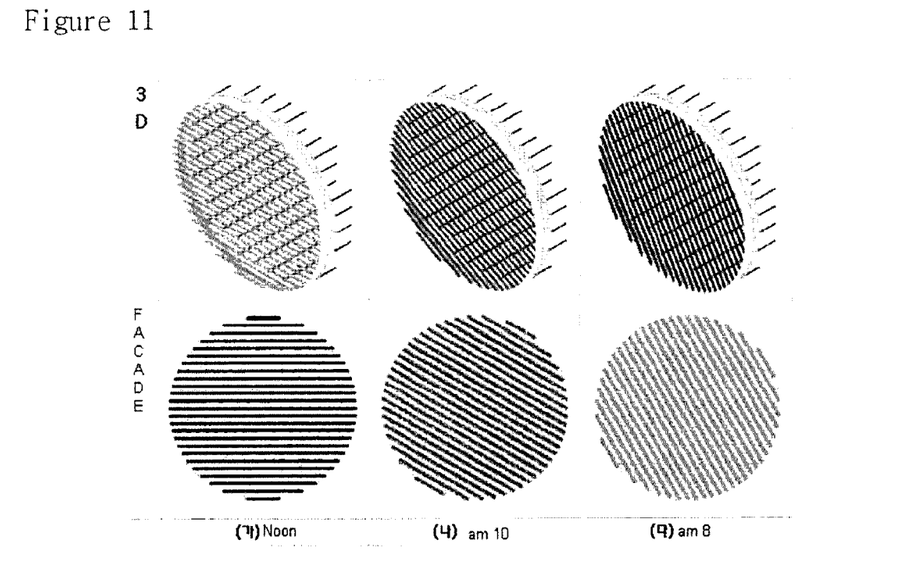
FIG. 11 illustrates controlling rotation of rotating frames and reflective members according to another embodiment of the present invention.

FIG. 11 illustrates controlling rotation of the rotating frames 60 and the reflective members 13.

Referring to FIG. 11, since the rotating frame 60 may be rotated right and left, rotation of the rotating frame 60 is controlled for the location of the reflective members 13 to be aligned with the location of solar light and since the reflective members 13 may be formed to mono rotate upward and downward, rotation of the rotating frame 60 and the reflective members 13 are controlled so as to align the reflective members 13 according to the location of solar light.

The mono rotation of the reflective members 13 may be controlled in the same manner as in biaxial rotation of the reflective member 11 and the rotating frame 60 may be mechanically controlled using bearings and motors.

In addition, the solar light condensing system may also include a CCD and a filter.

Performances of the vertical solar light condensing system according to the present invention are compared with those of the conventional lighting system using solar light tracking.

Since light condensing performances may be different in each system according to specification of the systems and a size of a light condensing unit, light condensing performances are compared according to change in the location (time) of solar light based on a seoul area on the assumption that a light condensing area is 1 m².

Figure 12:
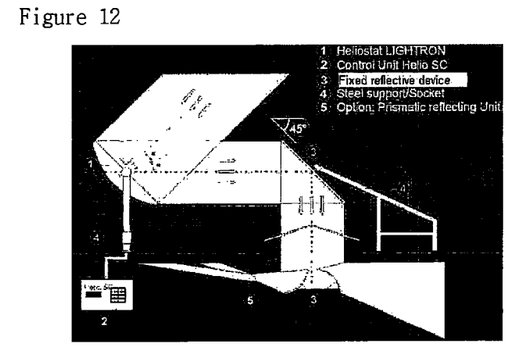
FIG. 12 illustrates a conventional solar light tracking type reflection lighting system using an optical duct formed on a roof of a building.
Figure 13:
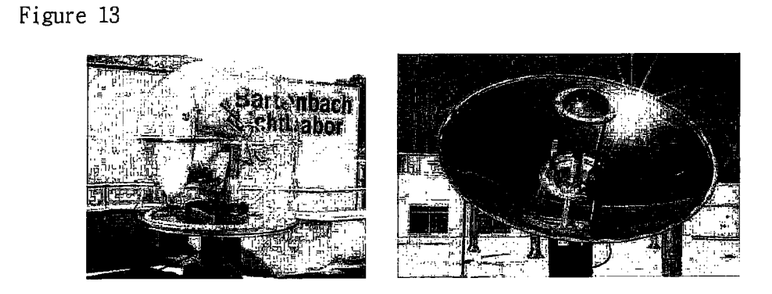
FIG. 13 illustrates a conventional solar light tracking type reflection lighting system using an optical fiber formed on a roof of a building.

Here, type A is the vertical solar light condensing system, type B is a conventional solar light tracking type reflection lighting system using an optical duct formed on a roof of a building illustrated in FIG. 12, and type C is a conventional solar light tracking type reflection lighting system using an optical fiber formed on a roof of a building illustrated in FIG. 13. Here, refraction and reflectivity of a penetrator and a reflector are not considered.

Table 1 below illustrates a comparison of light condensing efficiency according to a solar light tracking type.

| | | | Solar Position | | A | | | | B | C |
|---|---|---|---|---|---|---|---|---|---|---|
| | | | Altitude | | Tilt Angle from outer wall | | | | Roof | Roof |
| M | D | T | angle[°] | azimuth[°] | 0° | 10° | 20° | 30° | Reference | Reference |
| 6 | 21 | 8 | 37.3 | 91.6 | — | 0.07 | 0.18 | 0.27 | 0.72 | 1 |
| 6 | 21 | 9 | 49.2 | 83.0 | 0.08 | 0.21 | 0.33 | 0.45 | 0.73 | 1 |
| 6 | 21 | 10 | 60.8 | 69.9 | 0.17 | 0.32 | 0.46 | 0.58 | 0.76 | 1 |
| 6 | 21 | 11 | 71.0 | 46.7 | 0.22 | 0.38 | 0.53 | 0.67 | 0.78 | 1 |
| 6 | 21 | 12 | 75.9 | 0.0 | 0.24 | 0.41 | 0.56 | 0.70 | 0.79 | 1 |
| 6 | 21 | 13 | 71.0 | −46.7 | 0.22 | 0.38 | 0.53 | 0.67 | 0.78 | 1 |
| 6 | 21 | 14 | 60.8 | −69.9 | 0.17 | 0.32 | 0.46 | 0.58 | 0.76 | 1 |
| 6 | 21 | 15 | 49.2 | −83.0 | 0.08 | 0.21 | 0.33 | 0.45 | 0.73 | 1 |
| 6 | 21 | 16 | 37.3 | −91.6 | — | 0.07 | 0.18 | 0.27 | 0.72 | 1 |
| 12 | 21 | 8 | 7.0 | 53.2 | 0.59 | 0.61 | 0.60 | 0.58 | 0.89 | 1 |

-continued

| | | | Solar Position | | Condensing efficiency | | | | | |
| | | | Altitude | | A | | | | B | C |
| | | | | | Tilt Angle from outer wall | | | | Roof | Roof |
| M | D | T | angle[°] | azimuth[°] | 0° | 10° | 20° | 30° | Reference | Reference |
|---|---|---|---|---|---|---|---|---|---|---|
| 12 | 21 | 9  | 15.8 | 42.4   | 0.71 | 0.75 | 0.76 | 0.75 | 0.92 | 1 |
| 12 | 21 | 10 | 22.8 | 29.8   | 0.80 | 0.85 | 0.88 | 0.89 | 0.95 | 1 |
| 12 | 21 | 11 | 27.4 | 15.5   | 0.86 | 0.92 | 0.96 | 0.97 | 0.96 | 1 |
| 12 | 21 | 12 | 29.1 | 0.0    | 0.89 | 0.95 | 0.99 | 1.00 | 0.97 | 1 |
| 12 | 21 | 13 | 27.4 | −15.5  | 0.86 | 0.92 | 0.96 | 0.97 | 0.96 | 1 |
| 12 | 21 | 14 | 22.8 | −29.8  | 0.80 | 0.85 | 0.88 | 0.89 | 0.95 | 1 |
| 12 | 21 | 15 | 15.8 | −42.4  | 0.71 | 0.75 | 0.76 | 0.75 | 0.92 | 1 |
| 12 | 21 | 16 | 7.0  | −53.2  | 0.59 | 0.61 | 0.60 | 0.58 | 0.89 | 1 |

In table 1, quantities of incident light (condensed light) in type A and type B are compared based on a quantity of solar light vertically incident to a light condensing unit in type C.

Referring to Table 1, the vertical solar light condensing system installed on an outer wall (the surface of a wall) of a building as in type A respectively shows the light condensing efficiencies of about 80% and 20% in the winter solstice and in the summer solstice.

In comparison with the conventional lighting systems installed on a roof of a building in types B and C, the solar light condensing system in type A has lower light condensing efficiency. However, in consideration of the fact that condensing light from an outer wall of a building is difficult, an area for installing the light condensing unit on a roof of a building is restricted, and light transmission efficiency is reduced in each floor, according to the location of the sun in Korea, the light system according to the present invention is useful to be applied on an outer wall of a high building.

Figure 14:
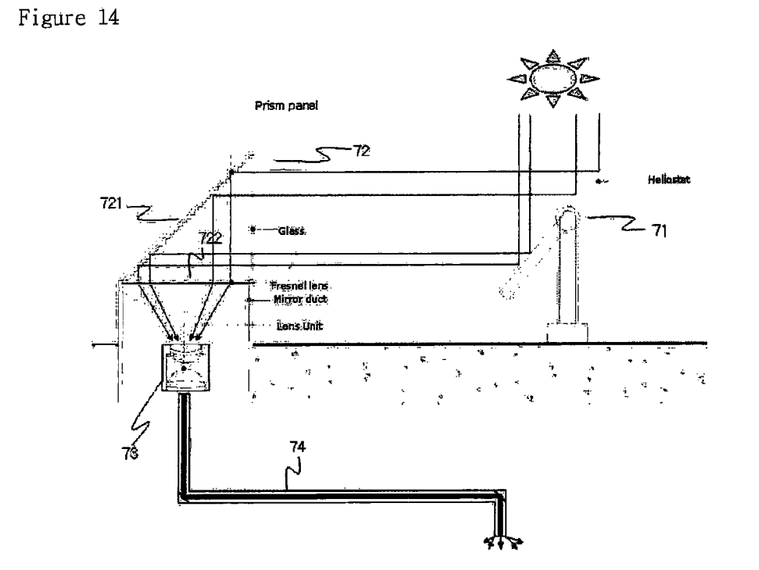
FIG. 14 schematically illustrates a solar light condensing system according to another embodiment of the present invention.

FIG. 14 schematically illustrates a solar light condensing system according to another embodiment of the present invention.

In the solar light condensing system according to the current embodiment, disadvantages of the fixed-type lighting system and the light condensing system using solar light tracking are supplemented so that efficient and stable natural lighting is possible.

Referring to FIG. 14, the solar light condensing system includes a reflective member 71, a light condensing member 72, a lens member 73, and a light transmission member 74, wherein the reflective member 71 reflects and transmits incident solar light, the light condensing member 72 condenses solar light transmitted from the reflective member 71, the lens member 73 converts solar light condensed in the light condensing member 72 into high-luminous flux parallel light, and the light transmission member 74 transmits the converted light.

Here, the reflective member 71 may be a solar light tracking reflective member for tracking solar light according to the location of solar light. Accordingly, the reflective member 71 may be formed of a light tracking control unit and a first reflection unit, wherein the light tracking control unit tracks the location of solar light and the first reflection unit reflects solar light tracked by the light tracking unit.

The light tracking control unit tracks the location of the sun in consideration of the change in the location of the sun throughout the year and thus, continuously reflects solar light to a regular direction through by the first reflection unit installed on the front surface of the reflective member 71.

The light tracking control unit automatically controls an angle of the first reflection unit according to the location (altitude) of the sun so as to track solar light and the detailed structure of the light tracking control unit would have been obvious to one of ordinary skill in the art so that detailed description thereof is omitted.

Also, the first reflection unit may be formed of any material which can reflect solar light and may be, for example, a reflective mirror or a reflective plate.

The light condensing member 72 condenses solar light transmitted from the reflective member 71.

More specifically, the light condensing member 72 may incline and include a second reflection unit 721 and a fresnel lens 722, wherein the second reflection unit 721 reflects solar light transmitted from the reflective member 71 and transmits the solar light to the lower part and the fresnel lens 722 formed on the lower part of the second reflection unit 721 condenses the transmitted solar light.

Here, the second reflection unit 721 may be any means which can reflect light and may be, for example, a prism panel or a reflective mirror.

When a prism panel is used as the second reflection unit 721, solar light reflected from the reflective member 71 flows in the prism panel, the solar light flowing to the prism panel reflects to a 90 degrees direction according to an optical characteristic of the prism, and the reflected solar light is condensed and focuses on the fresnel lens 722.

The lens member 73 converts solar light condensed in the light condensing member 72 into high-luminous flux parallel light.

Figure 15:
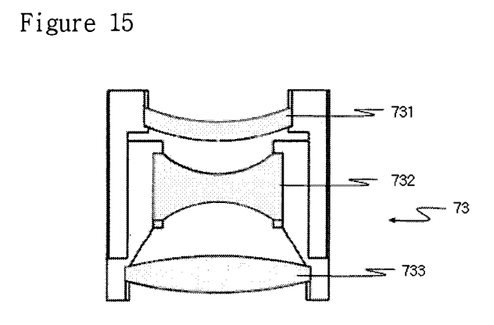
FIG. 15 is a detail view of a lens member of FIG. 14.

FIG. 15 is a detail view of the lens member 73 of FIG. 14.

Referring to FIG. 15, the lens member 73 includes a curved lens 731 on the upper part, a concave lens 732 on the lower part of the curved lens 731, and a convex lens 733 on the lower part of the concave lens 732.

The condensed solar light is converted into high-luminous flux parallel light through the lens member 73 formed of the concave lens 732 and the convex lens 733. With the high-luminous flux parallel light reproduced through the lens member 73, long-distance natural lighting is possible without limit of a light transmission distance based on straightness and high-luminous flux of light, if a space in the small unit area such as water pipes is secured. Here, the curved lens 731 condenses more light condensed in the fresnel lens 722 and transmits the condensed light to the concave lens 732.

More specifically, in terms of a principle, light condensed through the fresnel lens 722 is not high luminous flux and thus, does not have a straightness property so that light loss may occur in light transmission. Thus, if the concave lens 732 is installed on the lower part of the fresnel lens 722, luminous flux of condensed light is increased and parallel light having a straightness property may be created. Here, if the convex lens is installed on the lower part of the concave lens, straightness of light becomes better.

The lens member 73 may have any structure if condensed light can be converted into high-luminous flux parallel light and may be formed in various ways including a single concave lens and a combination of a plurality of concave lenses and convex lenses.

The light transmission member 74 transmits and supplies parallel light formed by converting from the condensed light in the lens member 73 to the inside of the building.

Here, the light transmission member 74 may be hollow for supplying parallel light to the inside of the building without a light loss and thus, light may be transmitted without a loss using air in the inside as a medium.

In addition, a bent unit of the light transmission member 74 may be formed by a reflective mirror or a prism 741 so as to easily change a light transmission path.

Figure 16:
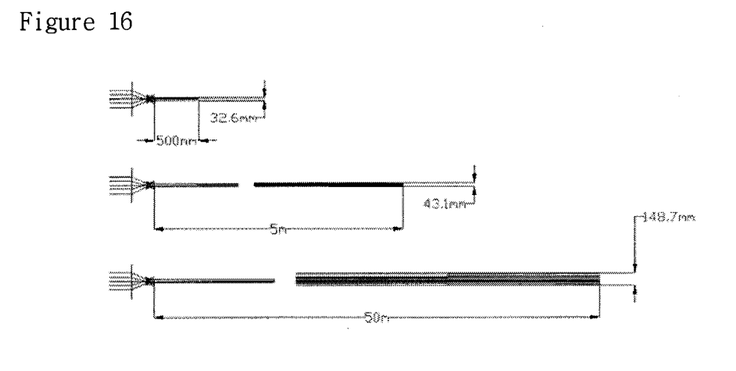
FIG. 16 illustrates parallel lights being generated and performance prediction for the parallel lights.

FIG. 16 illustrates parallel lights being generated and performance prediction for the parallel lights.

Referring to FIG. 16, a thickness of the light transmission member 74 may be determined according to the distance of the generated parallel light being transmitted.

In addition, light condensed to the focus of the fresnel lens 722 may be transmitted through the optical fiber 31 as described above, instead of the lens unit. When light is transmitted by the optical fiber, a light transmission path may be freely formed within a distance of 30 m.

The solar light condensing system in high luminous flux of light according to the current embodiment may be easily applied to general buildings, complex buildings, and underground establishments such as underground tunnels and subway station buildings, since a light transmission distance is not limited unless there is no limitations in securing visibility such as in floating matters or smoke and fog in the atmosphere.

Figure 17:
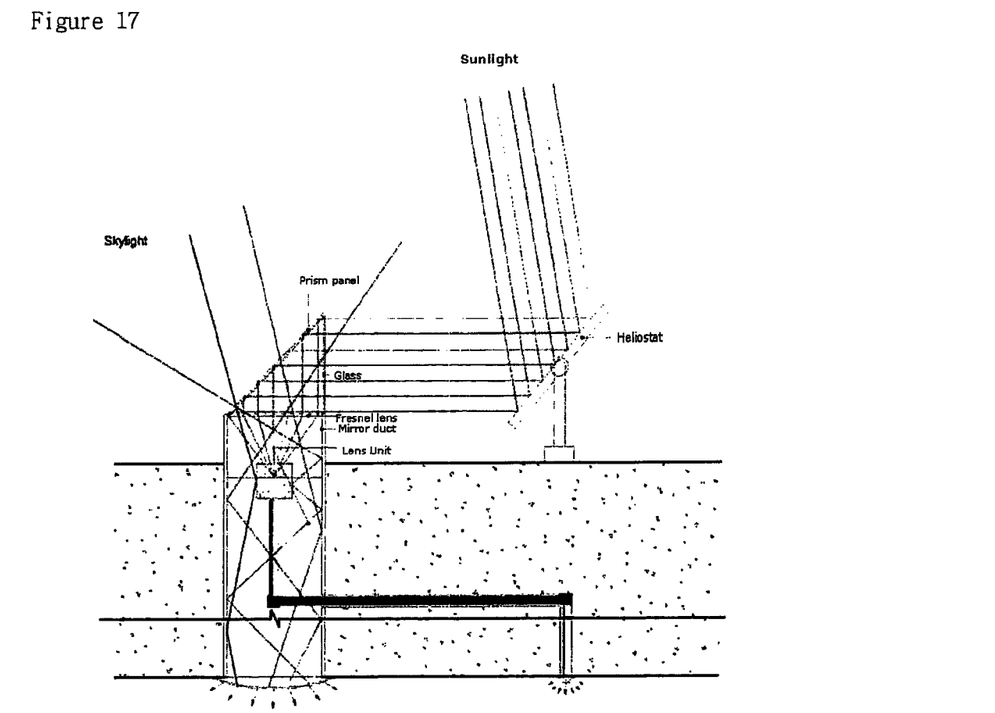
FIG. 17 illustrates a solar light condensing system further including an optical duct according to another embodiment of the present invention.

FIG. 17 illustrates the solar light condensing system further including an optical duct.

Referring to FIG. 17, the solar light condensing system as illustrated in FIG. 14 may further include the optical duct.

More specifically, the light condensing member 72 may be formed on the upper part of the optical duct and the lens member 73 and the light transmission member 74 are respectively formed inside the optical duct and on the lower part of the light condensing member 72 so that lighting by the optical duct and lighting by the solar light condensing system according to the current embodiment may be simultaneously applied.

A natural lighting unit by the optical duct is similar to a natural light system using a general optical duct and may be formed of a duct and an upper lighting unit, wherein the duct is formed of a mirror reflection material and the upper lighting unit is formed of a prism panel and a transparent penetrator.

In order to condense solar light using the solar light condensing system according to the current embodiment, the prism panel is disposed on the upper part of the optical duct and the prism panel reflects solar light flowing from a solar light tracking device and flows solar light and skylight flowing from the other direction in the inside the optical duct.

When a reflective mirror is used, instead of the prism panel, in order to reflect solar light flowing from the reflective member, the reflective mirror blocks solar light and skylight from flowing into the optical duct. Thus, when the prism panel is used, instead of the reflective mirror, there is no difficulty in natural lighting by the optical duct.

Due to a spatial limitation for installing the optical duct and a limitation in a light transmission distance, natural lighting by the optical duct may be applied to the upper most part of a building, underground establishments, and short-distance lighting.

The solar light condensing system according to the current embodiment may be horizontally or vertically installed according to a type of a building and a form of an applicable space.

Figure 18:
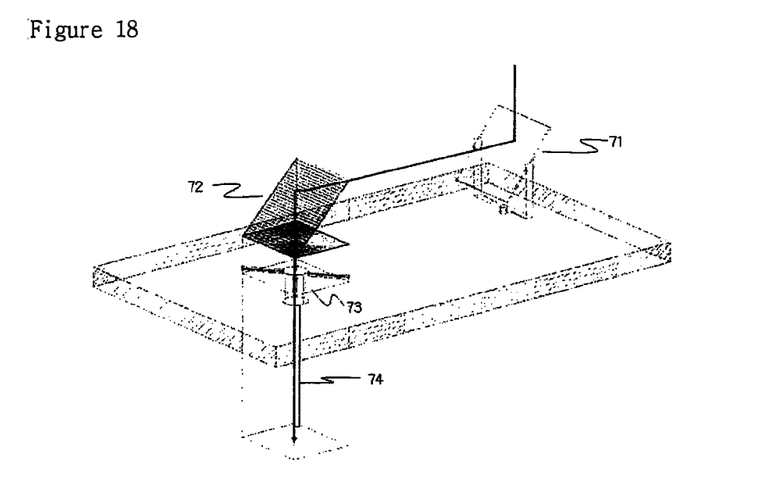
FIG. 18 illustrates a horizontal solar light condensing system according to another embodiment of the present invention.
Figure 19:
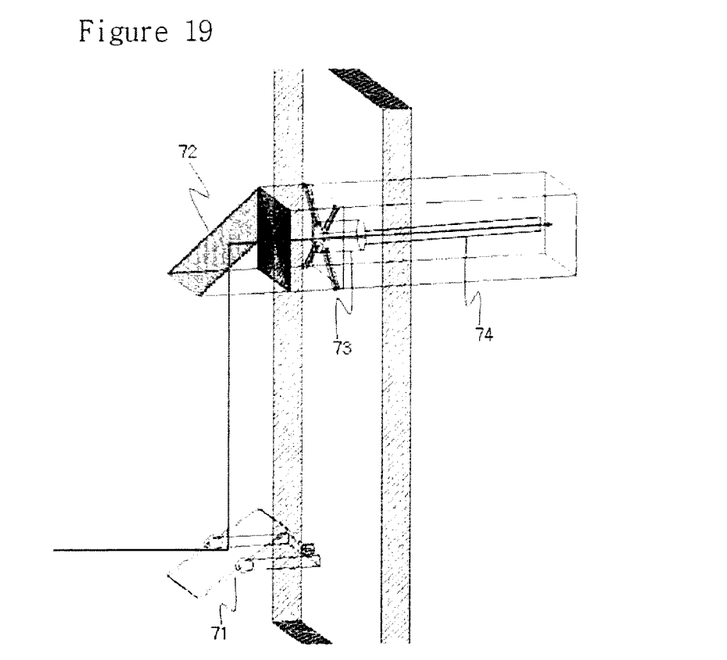
FIG. 19 illustrates a vertical solar light condensing system according to another embodiment of the present invention.

FIG. 18 illustrates a horizontal solar light condensing system and FIG. 19 illustrates a vertical solar light condensing system.

Referring to FIGS. 18 and 19, the horizontal solar light condensing system may be installed in a roof or the ground and may be applied to the upper stories or a staircase of a building and an underground space. The vertical solar light condensing system may be applied to each floor of a high building in an environment where there are large numbers of high buildings of over five floors as in Korea.

Figure 20:
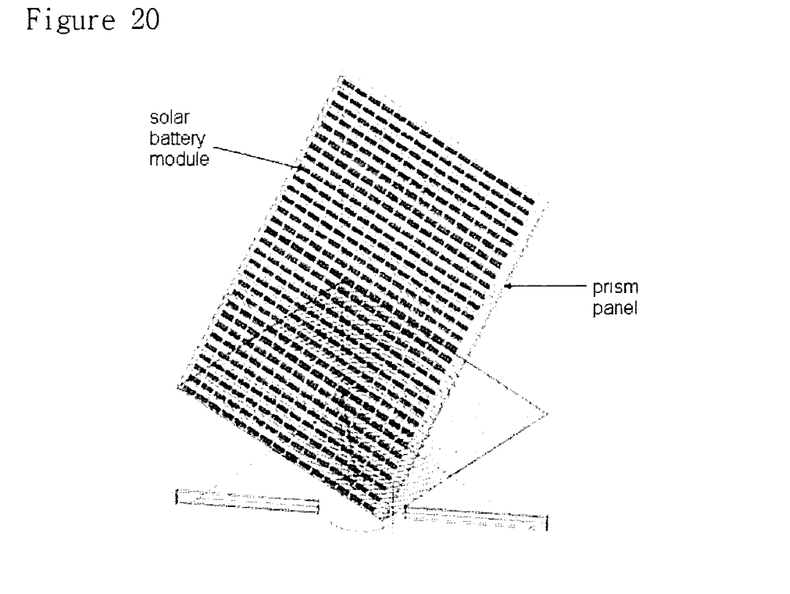
FIG. 20 illustrates a solar light condensing system including a prism panel to which solar light battery modules are attached.

FIG. 20 illustrates the solar light condensing system including the prism panel to which solar light battery modules are attached.

Referring to FIG. 20, when semi-permeable solar light battery modules are applied to the inclined surface of the prism panel, wherein the prism panel is disposed on the upper part of the optical duct (disposed outside in the horizontal type), a self power supply for operating the light tracking control unit of the reflection unit is possible without supplying separate power supply.

Power production through a solar battery is difficult at night or when the sun is hidden by the clouds. However, condensing of solar light is also difficult when solar light does not exist.

In addition, when the solar light battery modules are installed on the inclined surface of the outside the prism panel, natural light (solar light+skylight) penetrating the prism panel and flowing into the optical duct may be reduced. However, since currently developed semi-permeable solar light battery modules and transparent penetrator, instead of the prism panel, are used and thus, sufficient natural light may be flow into the optical duct, there is no difficulty in natural lighting through the optical duct.

INDUSTRIAL APPLICABILITY

The solar light condensing system using the front surface reflection member and the condenser lens is used in an outer wall of a building under a climate condition in Korea located at an solar altitude of between 30 degrees and 70 degrees and height light condensing efficiency can be obtained.

Also, regardless of a location of a building, the solar light condensing system can be installed to an outer wall of the building so as to secure large light condensing areas. In high buildings, a natural lighting system can be applied to each floor without a limitation of a light transmission distance.

In addition, since solar light is converted into high-luminous flux parallel light so as to be transmitted, a light loss can be minimized during transmitting light so that light condensing efficiency can be maximized. Thus, the solar light condensing system according to the present invention is applicable in a construction and environment industry.

The invention claimed is:
1. A solar light condensing system comprising:
a reflective member reflecting incident solar light;
a light condensing member provided in parallel to the reflective member and to be spaced apart from the reflective member condensing solar light transmitting from the reflective member;

a lens member provided at the lower part of the light condensing member converting the condensed solar light into high-luminous flux straight parallel light; and a light transmission member connected to the lower part of the lens member transmitting the high-luminous flux straight parallel light and supplying light.

2. The system of claim 1, wherein the reflective member comprises:

a light tracking control unit tracking solar light according to a location of solar light; and a reflection unit reflecting the solar light tracked by the light tracking control unit to a regular direction.

3. The system of claim 1, wherein the light condensing member comprises:

a reflection unit that is inclined reflecting the solar light transmitted from the reflective member and transmitting the light to the lower part; and a fresnel lens provided on the lower part of the reflection unit condensing the transmitted solar light.

4. The system of claim 3, wherein the reflection unit is formed of a reflective mirror or a prism panel.

5. The system of claim 4, wherein the prism panel comprises a solar light battery module on an inclined surface.

6. The system of claim 3, further comprising an optical duct, wherein the prism panel is provided at the upper part of the optical duct, the fresnel lens is provided inside the optical duct and on the lower part of the prism panel, the lens member is provided on the lower part of the prism panel, and the light transmission member is connected to the lower part of the lens member.

7. The system of claim 6, wherein the prism panel is semi-permeable so as for solar light and skylight to be simultaneously permeated.

8. The system of claim 1, wherein the lens member is a concave lens.

9. The system of claim 1, wherein the lens member further comprises a convex lens on the lower part of the concave lens.

10. The system of claim 9, wherein the lens member further comprises a curved lens on the upper part of the concave lens.

11. The system of claim 1, wherein the light transmission member is hollow so as for the solar light to be transmitted straight through air.

12. The system of claim 11, wherein a thickness of the light transmission member is determined according to a solar light transmission distance.

13. The system of claim 11, wherein the light transmission member further comprises a reflective element on a bent unit so as to reflect the straight solar light to 90 degrees.

\* \* \* \* \*